United States Patent
Bai

(10) Patent No.: US 9,412,860 B2
(45) Date of Patent: Aug. 9, 2016

(54) MULTI-LAYER GATE DIELECTRIC

(71) Applicant: Intel Corporation, Santa Clara, CA (US)

(72) Inventor: Gang Bai, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/054,778

(22) Filed: Oct. 15, 2013

(65) Prior Publication Data

US 2014/0042560 A1 Feb. 13, 2014

Related U.S. Application Data

(63) Continuation of application No. 12/976,211, filed on Dec. 22, 2010, now Pat. No. 8,581,353, which is a continuation of application No. 12/615,938, filed on Nov. 10, 2009, now Pat. No. 8,193,593, which is a continuation of application No. 09/109,261, filed on Jun. 30, 1998, now abandoned.

(51) Int. Cl.
| | |
|---|---|
| *H01L 29/76* | (2006.01) |
| *H01L 29/78* | (2006.01) |
| *H01L 29/51* | (2006.01) |
| *H01L 21/28* | (2006.01) |

(52) U.S. Cl.
CPC .......... *H01L 29/78* (2013.01); *H01L 21/28194* (2013.01); *H01L 29/511* (2013.01); *H01L 29/513* (2013.01); *H01L 29/517* (2013.01)

(58) Field of Classification Search
CPC ..... H01L 29/78; H01L 29/511; H01L 29/513; H01L 29/517

USPC .......... 257/295, 310, 410–412, E29.132, 257/E29.158, E29.16, E29.162–E29.165
See application file for complete search history.

(56) References Cited

U.S. PATENT DOCUMENTS

| | | | |
|---|---|---|---|
| 4,015,281 A | 3/1977 | Nagata et al. | |
| 4,656,054 A * | 4/1987 | Inoue | H01L 29/945 216/6 |
| 5,258,645 A | 11/1993 | Sato | |
| 5,292,673 A | 3/1994 | Shinriki et al. | |
| 5,355,011 A | 10/1994 | Takata | |
| 5,596,214 A | 1/1997 | Endo | |
| 5,619,051 A | 4/1997 | Endo | |
| 5,621,681 A | 4/1997 | Moon | |
| 5,963,810 A * | 10/1999 | Gardner | H01L 21/28194 257/E21.433 |
| 5,990,516 A | 11/1999 | Momose et al. | |
| 6,005,274 A | 12/1999 | Gardner et al. | |

FOREIGN PATENT DOCUMENTS

JP 6-29549 2/1994

OTHER PUBLICATIONS

Intel Corporation, Non-Final Office Action mailed Mar. 29, 2000, U.S. Appl. No. 09/109,261.

(Continued)

*Primary Examiner* — Matthew E Warren
(74) *Attorney, Agent, or Firm* — Green, Howard & Mughal LLP

(57) ABSTRACT

A transistor gate dielectric including a first dielectric material having a first dielectric constant and a second dielectric material having a second dielectric constant different from the first dielectric constant.

10 Claims, 1 Drawing Sheet

(56) References Cited

OTHER PUBLICATIONS

Intel Corporation, Final Office Action mailed Sep. 27, 2000, U.S. Appl. No. 09/109,261.
Intel Corporation, Non-Final Office Action mailed Jan. 31, 2001, U.S. Appl. No. 09/109,261.
Intel Corporation, Final Office Action mailed Aug. 13, 2001, U.S. Appl. No. 09/109,261.
Intel Corporation, Non-Final Office Action mailed Mar. 12, 2002, U.S. Appl. No. 09/109,261.
Intel Corporation, Final Office Action mailed Sep. 10, 2002, U.S. Appl. No. 09/109,261.
Intel Corporation, Non-Final Office Action mailed Feb. 24, 2003, U.S. Appl. No. 09/109,261.
Intel Corporation, Final Office Action mailed Aug. 27, 2003, U.S. Appl. No. 09/109,261.
Intel Corporation, Non-Final Office Action mailed Nov. 14, 2003, U.S. Appl. No. 09/109,261.
Intel Corporation, Final Office Action mailed Apr. 7, 2004, U.S. Appl. No. 09/109,261.
Intel Corporation, Non-Final Office Action mailed Jul. 28, 2004, U.S. Appl. No. 09/109,261.
Intel Corporation, Final Office Action mailed Jan. 26, 2005, U.S. Appl. No. 09/109,261.
Intel Corporation, Non-Final Office Action mailed Oct. 27, 2010, U.S. Appl. No. 12/615,938.
Intel Corporation, Final Office Action mailed Jan. 19, 2011, U.S. Appl. No. 12/615,938.
Intel Corporation, Non-Final Office Action mailed Oct. 12, 2012, U.S. Appl. No. 12/615,938.
Intel Corporation, Non-Final Office Action mailed Mar. 26, 2012, U.S. Appl. No. 12/976,211.
Intel Corporation, Final Office Action mailed Jul. 3, 2012, U.S. Appl. No. 12/976,211.
Intel Corporation, Non-Final Office Action mailed Dec. 27, 2012, U.S. Appl. No. 12/976,211.

* cited by examiner

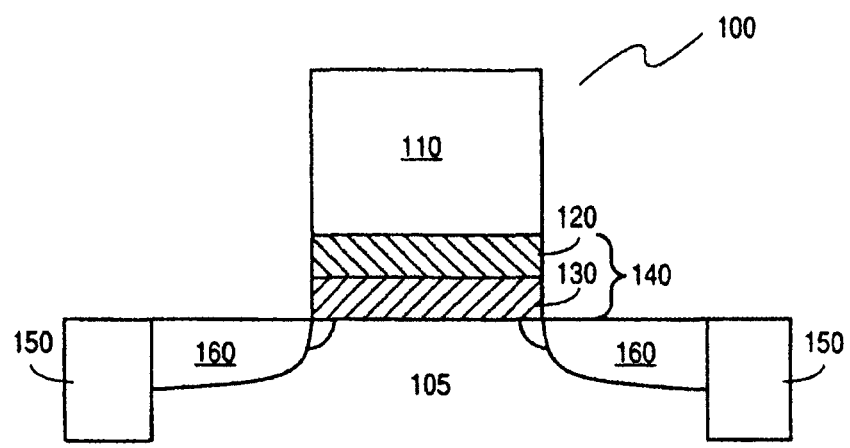

MULTI-LAYER GATE DIELECTRIC

CROSS REFERENCE TO RELATED APPLICATIONS

This application is a continuation of co-pending U.S. application Ser. No. 12/976,211 filed Dec. 22, 2010 which is a continuation of U.S. patent application Ser. No. 12/615,938 filed Nov. 10, 2009, which is a continuation of U.S. patent application Ser. No. 09/109,261 filed Jun. 30, 1998.

BACKGROUND OF THE INVENTION

1. Field of the Invention

The invention relates to integrated circuit devices and more particularly to enhancing dielectric material in those device.

2. Description of Related Art

One way to improve integrated circuit performance is through scaling the individual devices that comprise the integrated circuit. Thus, each subsequent generation of integrated circuit generally involves reducing the size of the individual devices on, for example, a semiconductor chip. The Morse rule is a common benchmark in the integrated circuit technology and provides that devices will be scaled down or reduced in size by one-third for each new generation.

The scale of a transistor device requires consideration of the desired performance of the device. For example, one goal may be to increase the current flow in the semiconductor material of the transistor. The current flow is proportional to the voltage applied to the gate electrode and the capacitance seen at the gate:

$$Q \propto C(V-V_{th})$$

where Q is one measure of the current flow, C is capacitance, V is the voltage applied to the gate electrode, and $V_{th}$ is the threshold voltage of the device.

To increase the voltage applied to a device requires an increase in power, P ($P \propto V^2$). However, at the same time as increasing the charge in the transistor, subsequent generations also seek to reduce the power required to run the device, since, importantly, a reduction of power reduces the heat generated by the device. Thus, to increase the current flow through the device without increasing the power requires an increase in the capacitance in the gate.

One way to increase the capacitance is by adjusting the thickness of the gate dielectric. In general, the capacitance is related to the gate dielectric by the following formula:

$$C = k_{ox}/t_{electrical}$$

where $k_{ox}$ is the dielectric constant of silicon dioxide ($SiO_2$) and $t_{electrical}$ is the electrical thickness of the gate dielectric. The electrical thickness of the gate dielectric is greater than the actual thickness of the dielectric in most semiconductor devices. In general, as carriers flow through the channel of a semiconductor-based transistor device there is a quantum effect experienced in the channel which causes an area directly below the gate to become insulative. The insulative region acts like an extension of the gate dielectric by essentially extending the dielectric into a portion of the channel. The second cause of increase gate dielectric thickness attributable to $t_{electrical}$ is experienced by a similar phenomenon happening in the gate electrode itself. At inversion, a gate electrode of polysilicon, for example, will generally experience a depletion of carriers in the area of the polysilicon near the gate dielectric. Accordingly, the gate dielectric appears to extend into the polysilicon gate electrode.

The result of the quantum effect in the channel and a depletion in the polysilicon gate electrode is an electrical thickness ($t_{electrical}$) of the gate dielectric greater than the actual thickness of the gate dielectric. The magnitude of the channel quantum effect and polysilicon depletion may be estimated or determined for a given technology. Accordingly, the electrical thickness ($t_{electrical}$) for a $SiO_2$ may be calculated and scaled for a given technology.

In considering the capacitance effects of the gate dielectric, a consideration of the thickness of gate dielectric is important for other reasons. First, the gate dielectric cannot be too thin as a thin gate dielectric will allow a leakage current from the channel through the gate electrode. At the same time, the gate dielectric cannot be too thick because such a gate structure may produce an undesirable fringe electric field. The desired electric field at the gate is typically perpendicular to the surface of the semiconductor substrate. Beyond a certain gate dielectric thickness, generally thought to be beyond one-third the lateral width of the gate electrode for a $SiO_2$ gate dielectric, the electrical field deviates from a perpendicular course and sprays about the gate electrode leading to an undesirable fringe electric field.

What is needed is a way to increase the capacitance of a gate dielectric without decreasing the performance of the device. It is preferable if the increased capacitance is consistent with scaling techniques and may be used in multiple generation technologies.

SUMMARY OF THE INVENTION

A transistor gate dielectric is disclosed. The transistor gate dielectric includes a first dielectric material having a first dielectric constant and a second dielectric material having a second dielectric constant different from the first dielectric constant.

BRIEF DESCRIPTION OF THE DRAWINGS

FIG. 1 is a schematic illustration of a side view of a transistor dielectric having a gate dielectric of a first dielectric material and a second dielectric material.

DETAILED DESCRIPTION OF THE INVENTION

The invention relates to a transistor gate dielectric made up of at least two different dielectric materials. For example, one embodiment contemplates a gate dielectric made up of two different dielectric materials each with its own dielectric constant. The dielectric material nearest the substrate, e.g., a semiconductor substrate will have a modest dielectric constant that produces a defect-free interface with the substrate and is stable against oxide formation. The second dielectric material will have a relatively high dielectric constant and be stable in contact with the desired gate material. By varying the thickness of the material, a gate dielectric can be formed that is scalable for different technology generations, has a low leakage current, and maintains an electric field of the gate perpendicular to the surface of the semiconductor. A transistor gate utilizing the multi-layer gate dielectric is also disclosed.

FIG. 1 illustrates an embodiment of the multi-layer gate dielectric of the invention. FIG. 1 shows transistor 100 consisting of gate electrode 110 overlying gate dielectric 140. Gate electrode 110 and gate dielectric 140 overlie semiconductor substrate 105 such as, for example, a silicon semiconductor substrate. Formed in substrate 105 adjacent transistor gate electrode 110 are diffusion or junction regions 160. The transistor is isolated from other devices, in this example, by shallow trench isolation structures 150.

Gate dielectric 140 is made up of, in this example, a bi-layer gate dielectric stack. The gate dielectric material is deposited by conventional techniques such as chemical vapor deposition or other deposition techniques according to the specifics of the material. The individual dielectric materials that make up the gate dielectric stack are patterned using conventional techniques such as masking and etching.

In one embodiment, the bottom dielectric layer 130 is selected to have a modest dielectric constant, $k_1$, that forms a generally defect-free interface with substrate 105. A generally defect-free interface is one that has a sufficiently high (e.g., >8 MV/cm) dielectric breakdown strength implying that the dielectric layer is pin-hole free and contains a negligible number of defects that would lead to breakdown of the dielectric layer at lower electric fields. Bottom dielectric layer 130 should also be stable on silicon and stable against oxide formation. In one embodiment, bottom dielectric layer 130 materials are chosen that have a heat of formation greater than the heat of formation of $SiO_2$. The chemistry in terms of stability of bottom layer 130 is important to achieve the low defect interface. Examples of suitable bottom dielectric layer 130 include, but are not limited to, hafnium oxide ($HfO_2$), zirconium oxide ($ZrO_2$), barium oxide (BaO), lanthanum oxide ($La_2O_3$), and yttrium oxide ($Y_2O_3$).

In this embodiment, top dielectric layer 120 is selected to have a relatively high dielectric constant, $k_2$, and is a material that is stable in contact with gate electrode 110. Examples of suitable top dielectric layers are $BaSrTiO_3$ (BST) and $PbZrTiO_3$ (PZT). One function of top dielectric layer 120 is to block any leakage current through bottom dielectric layer 130, without adding to the equivalent thickness of gate dielectric 140 (i.e., equivalent thickness of an $SiO_2$ gate dielectric) and contributing to the production of a fringe electric field.

One guideline to select the appropriate dielectric layer thickness $t_1$ for bottom dielectric layer 130, and $t_2$ for top dielectric layer 120, is the following. For a given technology generation (i.e., a given gate length of gate electrode 110 and equivalent oxide thickness of a $SiO_2$ gate dielectric, $t_{ox}$), a total thickness, t, of gate dielectric 140 should be less than one-third of the gate length of gate electrode 110. The effective dielectric constant, k, may then be determined by the following relationship:

$$k = k_{ox}(t/t_{ox}) \quad (1)$$

wherein $k_{ox}$ is the dielectric constant of $SiO_2$ which is typically represented as 4.0.

Combining the above relationship with a relationship for calculating the effective dielectric constant of gate dielectric 140 of the following:

$$k = t/(t_1/k_1 + t_2/k_2), \quad (2)$$

the total thickness of dielectric layer 140 may be calculated:

$$t = t_1 + t_2. \quad (3)$$

Combining equations (1), (2), and (3) yields the following:

$$t_1/k_1 + t_2/k_2 = t_{ox}/k_{ox}. \quad (4)$$

Equation (4) is then solved for a thickness of bottom dielectric layer 130 having a known dielectric constant, $k_1$, and top dielectric layer 120 also having a known dielectric constant, $k_2$. Table I shows the individual thicknesses of first dielectric layer 130 ($t_1$) and second dielectric layer 120 ($t_2$) for various technologies scaled by the Morse rule starting with a gate electrode length of 150 nanometers, for a $k_1$ of 30 and a $k_2$ of 300.

Table I demonstrates that a multi-layer dielectric gate stack, in this case, a bi-layer dielectric gate stack, is scalable for a given technology. For example, for each technology, given a first dielectric layer 130 having a dielectric constant $k_1$ of 30 and a second dielectric layer 120 having a dielectric constant $k_2$ of 300, a total gate dielectric layer thickness less than one-third of the individual gate lengths is maintained. Further, the choice of second gate dielectric layer 120 of material to block the leakage current maintains the performance of the device. Finally, by manipulating the gate dielectric materials, the capacitance of the device may be appropriately increased for the given technology.

For a gate electrode 110 that is polysilicon, a third dielectric layer may be utilized to act as a barrier layer to prevent interaction between top dielectric layer 120 materials having high dielectric constants and the polysilicon gate material. Suitable third dielectric materials include, but are not limited to, $HfO_2$, $ZrO_2$, BaO, $La_2O_3$, and $Y_2O_3$ (notably the same materials suitable as bottom dielectric layer 130).

The above example is described with respect to gate electrode 110 being a polysilicon. It is to be appreciated that the same principles may be applied to gate electrodes of different materials, such as, for example, metal gates. In the case of a metal gate electrode, the electrical thickness ($t_{electrical}$) may be reduced since, in general, metal gate electrodes do not experience the depletion seen by polysilicon. Table I also shows the scaling of the bi-layer dielectric materials discussed above using metal gate technology.

TABLE I

| Technology Generation | 1 | 2 | 3 | 4 | 5 | 6 |
|---|---|---|---|---|---|---|
| Lgate (nm) | 150 | 100 | 70 | 50 | 35 | 25 |
| t_electrical (Å) | 30 | 21 | 15 | 10 | 7 | 5 |
| t_ox (Å): metal gate | 26 | 17 | 11 | 6 | 3 | 1 |
| t (Å): total stack thick | 300 | 210 | 147 | 103 | 72 | 50 |
| $t_1$ (Å), $k_1$ = 30 | 183 | 118 | 75 | 39 | 17 | 3 |
| $t_2$ (Å), $k_2$ = 300 | 117 | 92 | 72 | 64 | 55 | 48 |

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed:

1. A transistor gate stack comprising:
   a substrate;
   a gate dielectric disposed on the substrate, the gate dielectric comprising:
     a first dielectric layer, having a first dielectric constant comprising a first metal oxide;
     a second dielectric layer disposed on the first dielectric layer and having a second dielectric constant higher than the first dielectric constant, the second dielectric layer comprising a second metal oxide; and
     a third dielectric layer disposed on the second dielectric layer and having a third dielectric constant lower than the second dielectric constant, the third dielectric layer comprising a third metal oxide being different from the second metal oxide and same material as that of the first metal oxide; and
   a metal gate electrode disposed on the gate dielectric.

2. The transistor gate stack of claim 1, wherein the gate dielectric has a total thickness less than one third of a length of the metal gate.

3. The transistor gate stack of claim 1, wherein the second dielectric layer comprises titanium (Ti).

4. The transistor gate stack of claim 1, wherein the substrate is a silicon substrate.

5. The transistor gate stack of claim 1, wherein the first dielectric layer is formed of a material having heat of formation greater than the heat of formation of $SiO_2$.

6. The transistor gate stack of claim 1, wherein the first and third metal oxides are formed of at least one of: $HfO_2$, $ZrO_2$, $BaO$, $La_2O_3$, or $Y2O_3$.

7. The transistor gate stack of claim 1, wherein the first dielectric layer has a dielectric breakdown strength greater than 8 MV/cm.

8. The transistor gate stack of claim 1, wherein the second metal oxide is formed of at least one of: $BaSrTiO_3$ or $PbZrTiO_3$.

9. The transistor gate stack of claim 1, wherein the first and third metal oxides are formed of a material selected from a group consisting of: $HfO_2$, $ZrO_2$, $BaO$, $La_2O_3$, and $Y2O_3$.

10. The transistor gate stack of claim 1, wherein the second metal oxide is formed of a material selected from a group consisting of: $BaSrTiO_3$ and $PbZrTiO_3$.

* * * * *